US005572435A

United States Patent [19]

Kaltenecker

[11] Patent Number: 5,572,435

[45] Date of Patent: Nov. 5, 1996

[54] METHOD FOR DESIGNING A TRANSFORMER

[75] Inventor: Robert S. Kaltenecker, Mesa, Ariz.

[73] Assignee: Motorola, Inc., Schaumburg, Ill.

[21] Appl. No.: 202,610

[22] Filed: Feb. 28, 1994

[51] Int. Cl.[6] .......... G06F 19/00; G01R 15/18

[52] U.S. Cl. .......... 364/488; 364/578; 364/481

[58] Field of Search .......... 364/488, 578, 364/481, 20, 170, 171

[56] References Cited

U.S. PATENT DOCUMENTS

| | | | |
|---|---|---|---|
| 4,817,011 | 3/1989 | Davis | 364/578 |
| 5,331,533 | 7/1994 | Smith | 363/20 |
| 5,438,294 | 8/1995 | Smith | 327/384 |

OTHER PUBLICATIONS

Oguz Soysal. Oct. 1993. "A Method for Wide Frequency Range Modeling of Power Transformers and Rotating Machines." IEEE Transactions On Power Delivery vol. 8, No. 4, pp. 1802–1810.

V. A. Niemela et al. 1992. "Frequency–Independent–Element Cross–Coupled–Secondaries Model for Multiwinding Transformers." PESC '92 Record. 23rd Annual IEEE Power Electronics Specialists Conference (CAT. No. 92CH3163–3) vol. 2, pp. 1261–1268.

Liu Xiucheng et al. Mar. 1991. "Simulation of the Voltage Distribution in EHV Transformer Windings During Switching Impulse Withstand Test." Proceedings of the CSEE. vol. 11, No. 2, pp. 15–21.

*Primary Examiner*—Vincent N. Trans

*Attorney, Agent, or Firm*—Rennie William Dover; Bradley J. Botsch, Sr.

[57] ABSTRACT

A method for designing and making an RF transformer has been provided. The method utilizes a model for an RF transformer wherein the model has parameters that directly relate to a physical construction of the components of the transformer, namely, a core and a twisted wire. The method separates the core from the twisted wire so that characteristics of each can be separately determined. These determined characteristics are then optimized and used to design and make a transformer.

9 Claims, 2 Drawing Sheets

METHOD FOR DESIGNING A TRANSFORMER

FIELD OF THE INVENTION

This invention relates to transformers, and in particular, to a method for designing an RF transformer for enhanced performance.

BACKGROUND OF THE INVENTION

One way to make an RF transformer is to take a section of twisted wire and a core and wrap the twisted wire around the core a predetermined number of turns. Such a transformer configuration has a plurality of parameters such as the inductance of each individual wire when wrapped around the core and a cross coupling inductance between each of the individual wires. Moreover, because of the widespread use of transformers, it would be desirable to have a model of the transformer and a method for making transformers so that performance of RF transformers can be optimized.

Typically, one method of obtaining information about RF transformers is to obtain many samples of wire and ferrite cores being used and to manually wind a transformer and then measure various parameters. This can be done repeatedly to eventually obtain a large amount of empirical data wherein this empirical data can then be used to design a desired transformer. This laborious method obviously suffers from the disadvantages that is difficult to optimize the design since no model is created and it is time consuming.

There currently exist other models for a transformer. For example, a low frequency model for a transformer may include two parallel inductors that are mutually coupled wherein a resistor is coupled across one of the inductors. In addition, a high frequency model may include a similar configuration but further including capacitors and/or inductors coupled across the mutually coupled inductors. However, no model is applicable for characterizing a transformer for both low and high frequency ranges.

Hence, there exists a need for an improved technique for modeling a transformer and an improved method for designing a transformer for enhanced performance.

DETAILED DESCRIPTION OF THE DRAWINGS

Figure 1:
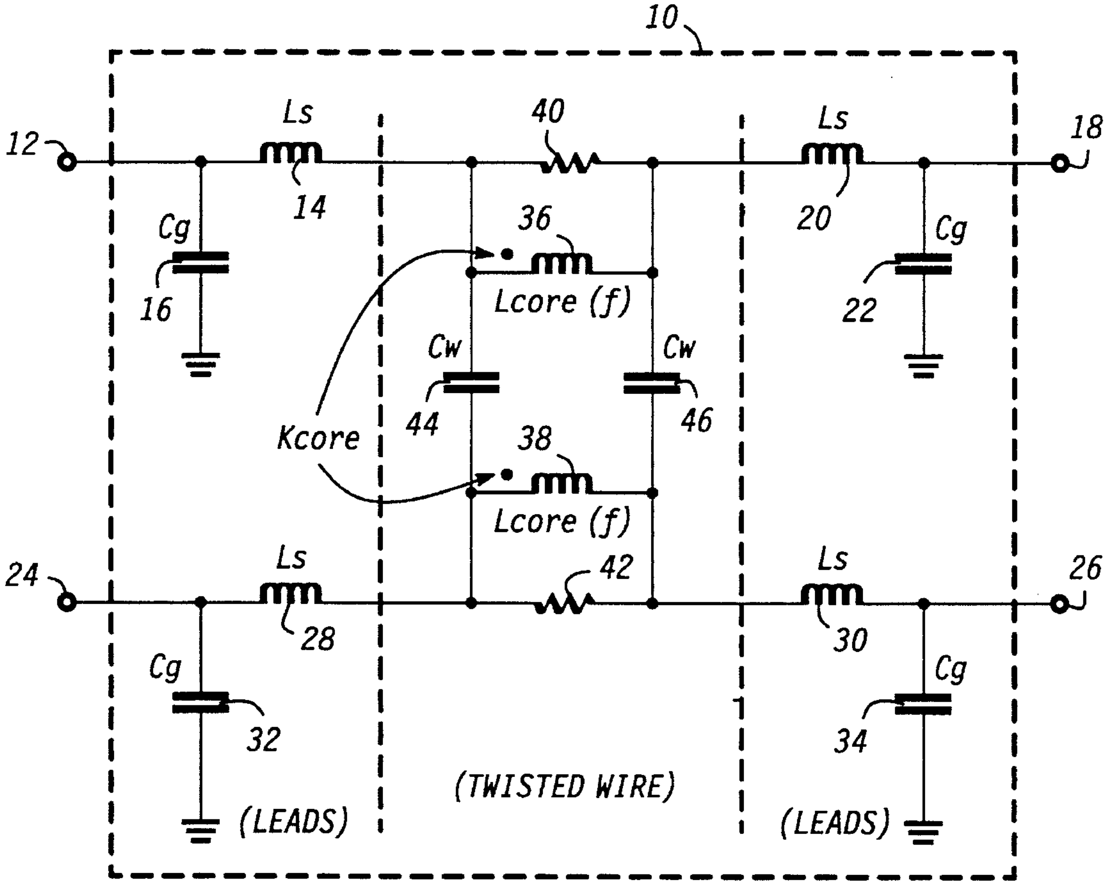
FIG. 1 is a detailed schematic diagram illustrating a model for an RF transformer in accordance with an embodiment of the present invention.

FIG. 1 is a detailed schematic diagram illustrating model 10 for a two wire transformer. This model represents a transformer being fabricated by first and second wires being twisted together and then wrapped around a core.

The first wire, which has a first end coupled to terminal 12, has a series lead inductance as represented by inductor 14 and a capacitance to ground as represented by capacitor 16. Similarly, the second end of the first wire is coupled to terminal 18 wherein its series inductance is represented by inductor and its capacitance to ground is represented by capacitor 22.

In a similar manner, the second wire has a first end coupled to terminal 24 and a second end coupled to terminal 26. The second wire has similar series inductances as represented by inductors 14 and 20 for the first wire and is represented by inductors 28 and 30, respectively. Moreover, the second wire has capacitances to ground similar to those represented by capacitors 16 and 22 for the first wire and is represented by capacitors 32 and 34, respectively.

When a wire is wrapped around a core, there exists an inductance between the ends of the wire which is a function of both frequency and the magnetic properties of the core material. Such an inductance for the first wire is represented by inductor 36. A similar inductance for the second wire is represented by inductor 38.

Additionally, when wire wrapped around is core, there exists a resistance between the ends of the wire. Such a resistance for the first and second wires is respectively represented by resistors 40 and 42.

Since the first and second wires are actually twisted wires, there further exists a mutual inductance between the two wires as represented by coupling factor $K_{CORE}$.

Moreover, there exists a capacitance between the two wires as represented by capacitors 44 and 46.

This combination of elements describing the model for the twisted wire RF transformer has been derived from the actual physical construction of the RF transformer. That is, each model parameter can be related to the physical parameters of the elements that make up the RF transformer, namely the twisted wire and the core. For example the series lead inductances (the portion of the wire that is not wrapped around the core) represented by inductors 14, 20, 28 and 30 are the actual inductances for the leads of the RF transformer. The inductance value of these series inductors is directly proportional to the physical length of the RF transformer leads, hence a direct relationship is apparent. The capacitance between the twisted wire represented by capacitors 44 and 46 is directly related to the wire insulation thickness, relative dielectric constant of the wire insulation and the twist rate of the wire, hence this parameter of the model is directly related to the physical properties of the twisted wire. Similarly the self inductances 36 and 38 are directly related to the magnetic properties of the core material and the physical configuration of the twisted wire wrapped around the core. All of the model parameters are directly related to the physical construction of the RF transformer.

Figure 2:
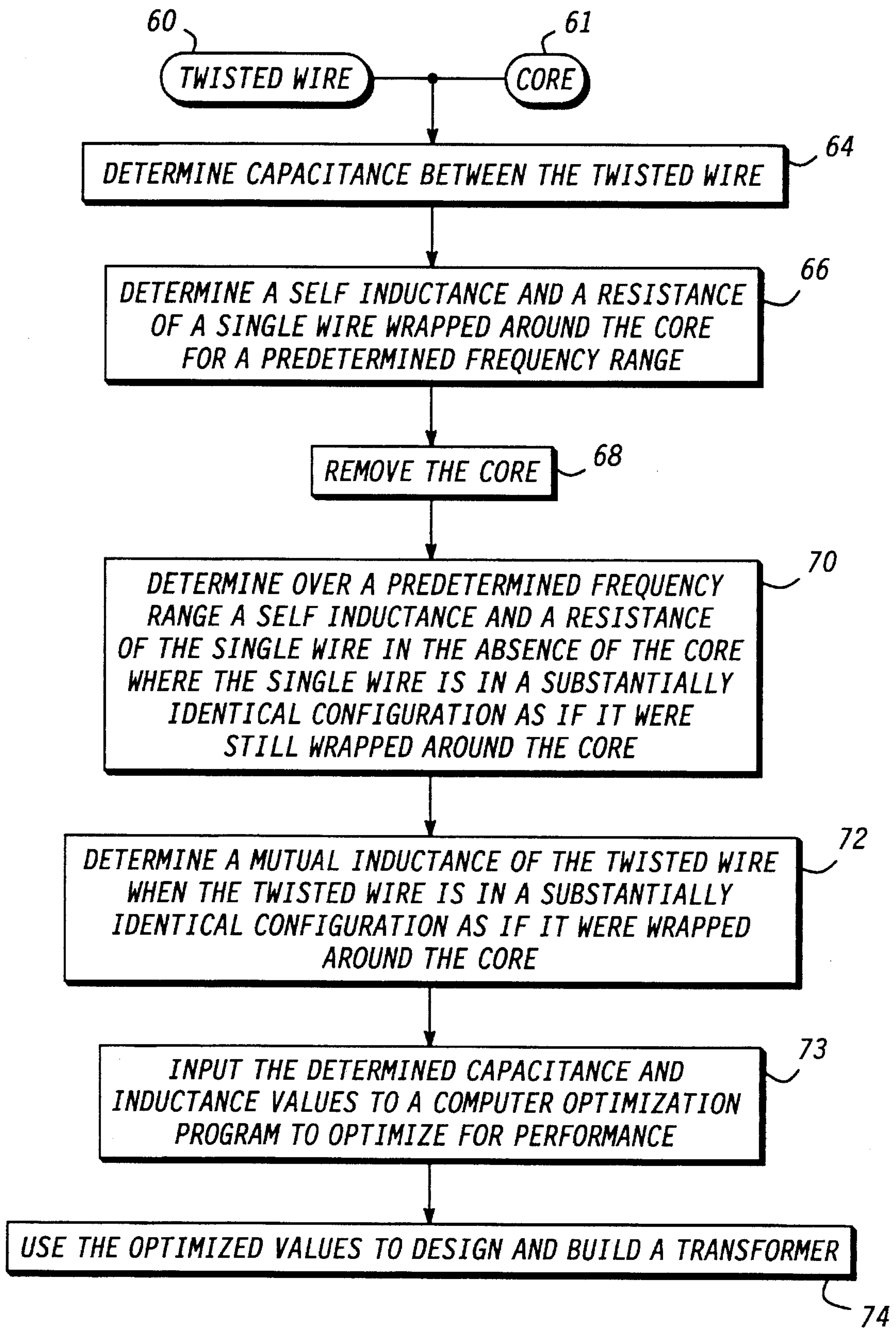
FIG. 2 is a flowchart of a method for designing an RF transformer in accordance with the model of FIG. 1.

FIG. 2 illustrates the steps of a method for designing an RF transformer. The RF transformer is constructed using twisted wire and a core as illustrated in circles 60 and 61, respectively. The first step, as illustrated by box 64, is the determination of the capacitance between the twisted wire, wherein this capacitance is represented in the RF transformer model 10 (of FIG. 1) by capacitors 44 and 46. This step involves determining a characteristic of the twisted wire when separated from the core. The capacitance between the twisted wire is determined by obtaining a length of the twisted wire and performing a capacitance measurement. The unit length capacitance of the twisted wire is found by dividing the measured capacitance by the length of the wire.

The next step, as illustrated by box 66, is to determine the self inductance and resistance, over a predetermined frequency range, of a single wire wrapped around the core. Typically, the single wire is substantially identical to one of the wires used in the twisted wire RF transformer, but this is not a requirement. When a single wire is wrapped around the core, the portions of the single wire not wrapped around the core are referred to as the leads and they have a predefined physical length. From this length and knowledge of the diameter of the wire, the series lead inductances ($L_S$) of the single wire can be determined. From an impedance measurement, over a predetermined frequency range, the total inductance and resistance of the single wire wrapped around a core are determined. The value of the total inductance is the sum of the series lead inductances ($L_S$) and the core inductance ($L_{CORE}$) in the RF transformer model of FIG. 1. Thus, from this measurement, the inductance 36 and resistance 40 can be determined since the lead inductance has already been ascertained as discussed above. The values of components 36 and 40 (as well as components 38 and 42) are functions of frequency and are directly related to the magnetic properties of the core and the physical configuration of the wire wrapped around the core. As can be seen, this step involves determining a characteristic of the core when separated from the twisted wire. Or alternatively, this step involves determining a characteristic of the twisted wire by using a single wire.

Removal of the core, as illustrated by box 68, allows for the determination, over a predefined frequency range, of the self inductance of the single wire in the absence of the core where the single wire is in a substantially identical configuration as if it were still wrapped around the core wherein the single wire is substantially identical to one of the wires used in the twisted wire RF transformer. A single wire is wrapped around the core, and then the core is removed. From an impedance measurement, over a predetermined frequency range, the total inductance of this single wire wrapped in a substantially identical configuration as if it were still wrapped around the core is determined. The value of the total inductance is the sum of the series lead inductances and an air core inductance. Since, the series lead inductance is already known, the air core inductance can be ascertained. Moreover, from the air core inductance and the core inductance values, the mutual coupling factor Kcore in the RF transformer model of FIG. 1 can be determined. It is worth noting that the mutual coupling factor Kcore can be determined by wrapping the twisted wire around the core and making appropriate measurements.

The capacitances to ground represented by capacitors 16, 22, 32 and 34 can be determined by measuring the capacitance to ground of the single wire wrapped in a substantially identical configuration as if it were still wrapped around the core. Having determined all of the RF transformer model parameters, these values can be entered into a computer program to determine the optimum values of these parameters for a particular application of the RF transformer, as illustrated by box 72. This computer program should be suitable for circuit analysis with optimization capability such as the Microwave Design System by Hewlett Packard. These optimized values are then used to design and specify the components 60 and 61 that make up the RF transformer. As a result, for a given application, the necessary physical properties of the twisted wire and core material to produce the optimum transformer response are ascertained wherein this optimum transformer response may be optimized, for example, with respect to bandwidth, desired transformation ratio and minimum insertion loss. Moreover, since the model parameters are directly related to the physical construction and properties of the transformer, the effects of physical variations or tolerances in the components 60 and 61 on the RF performance of the transformer can be readily examined.

The present invention provides a method for designing an RF transformer having an enhanced performance. With such a method, the optimum wire and core properties necessary for a particular application are readily obtained in terms of measurable physical parameters that are directly related to the components of the RF transformer, namely the twisted wire and the core. Previously this direct physical relationship between the components that are used to construct the transformer, namely the twisted wire and core and the electrical performance of the RF transformer was not available. With these relationships, empirically based and time consuming techniques are eliminated, and more importantly an optimum solution can be determined. Additionally, the present invention provides a method for designing and making an RF transformer. The method utilizes a model for an RF transformer wherein the model has parameters that directly relate to a physical construction of the components of the transformer, namely, a core and a twisted wire. The method separates the core from the twisted wire so that characteristics of each can be separately determined. These determined characteristics are then optimized and used to design and make a transformer.

While the invention has been described in specific embodiments thereof, it is evident that many alterations, modifications and variations will be apparent to those skilled in the art. Further, it is intended to embrace all such alterations, modifications and variations in the appended claims.

I claim:

1. A method for making a transformer, the transformer including a core and twisted wires, the method utilizing a model for the transformer wherein the model has parameters that relate to a physical construction of the core and the twisted wires, the method comprising the steps of:

measuring a capacitance between the twisted wires;

measuring, over a predetermined frequency range, a self inductance and a resistance of a single wire wrapped around the core;

measuring, over a predetermined frequency range, a self inductance and a resistance of said single wire in the absence of the core wherein a physical geometry of said single wire is in a substantially identical configuration as if said single wire was wrapped around the core;

measuring a mutual inductance of the twisted wires when in a substantially identical configuration as if the twisted wires were wrapped around the core;

optimizing said measured inductances, capacitances and resistances; and using said optimized inductances, capacitances and resistances to make a transformer.

2. The method according to claim 1 wherein said measuring a capacitance includes the steps of:

measuring a per unit length capacitance between the twisted wires; and measuring an electrical length of the twisted wires.

3. The method according to claim 1 wherein the single wire is one of the twisted wires.

4. A method for making a transformer, the transformer including a core and twisted wires, the method utilizing a model for the transformer wherein the model has parameters that relate to a physical construction of the core and the twisted wires, the method comprising the steps of:

measuring a capacitance between the twisted wires;

measuring, over a predetermined frequency range, a self inductance and a resistance of a single wire wrapped around the core;

measuring, over a predetermined frequency range, a self inductance and a resistance of said single wire in the absence of the core wherein a physical geometry of said single wire is in a substantially identical configuration as if said single wire was wrapped around the core;

measuring a mutual inductance of the twisted wire when wrapped around the core;

optimizing said measured inductances, capacitances and resistances; and using said optimized inductances, capacitances and resistances to make a transformer.

5. The method according to claim 4 wherein said measuring a capacitance includes the steps of:

measuring a per unit length capacitance between the twisted wires; and measuring an electrical length of the twisted wires.

6. The method according to claim 4 wherein the single wire is one of the twisted wires.

7. A method for making a transformer, the transformer being fabricated from twisted wires and a core, the method comprising the steps of:

measuring the at least one characteristic of the twisted wires when separated from the core;

measuring at least one characteristic of the core when separated from the twisted wires;

optimizing said measured characteristics; and using said optimized characteristics to make a transformer.

8. The method according to claim 7 wherein said measuring at least one characteristic of the twisted wires when separated from the core includes measuring a capacitance between the twisted wires.

9. The method according to claim 7 wherein said measuring at least one characteristic of the core when separated from the twisted wires includes determining an inductance of the core.

* * * * *